United States Patent
Riley et al.

(10) Patent No.: US 10,698,033 B2
(45) Date of Patent: Jun. 30, 2020

(54) SENSOR FAULT DETECTION USING PAIRED SAMPLE CORRELATION

(71) Applicants: Robert Bosch Battery Systems, LLC, Orion, MI (US); Robert Bosch GmbH, Stuttgart (DE)

(72) Inventors: Blake Joseph Riley, Chesterfield, MI (US); Carlton Brown, Royal Oak, MI (US)

(73) Assignees: Robert Bosch Battery Systems, LLC, Orion, MI (US); Robert Bosch GmbH, Stuttgart (DE)

( * ) Notice: Subject to any disclaimer, the term of this patent is extended or adjusted under 35 U.S.C. 154(b) by 271 days.

(21) Appl. No.: 15/850,521

(22) Filed: Dec. 21, 2017

(65) Prior Publication Data

US 2019/0195952 A1     Jun. 27, 2019

(51) Int. Cl.
*G01R 31/382*  (2019.01)
*G01R 31/08*   (2020.01)
(Continued)

(52) U.S. Cl.
CPC .......... *G01R 31/382* (2019.01); *G01R 31/08* (2013.01); *G01R 31/2829* (2013.01);
(Continued)

(58) Field of Classification Search
CPC ............. G01R 31/382; G01R 31/389; G01R 31/3842; G01R 31/374; G01R 31/08; G01R 31/2829; G01V 3/26; G01N 1/34; G06T 5/50

USPC ... 324/425–435, 500, 750.3, 757.04, 762.03, 324/600, 663, 671, 200, 207.13, 207.22, 324/239, 241, 515, 520, 530, 76.11, 324/105–124

See application file for complete search history.

(56) References Cited

U.S. PATENT DOCUMENTS

| | | |
|---|---|---|
| 4,337,516 A | 6/1982 | Murphy et al. |
| 5,365,453 A | 11/1994 | Startup et al. |

(Continued)

FOREIGN PATENT DOCUMENTS

| | | |
|---|---|---|
| DE | 102016204944 A1 | 9/2017 |
| JP | 2011209086 A | 10/2011 |

(Continued)

*Primary Examiner* — Melissa J Koval
*Assistant Examiner* — Trung Nguyen
(74) *Attorney, Agent, or Firm* — Maginot, Moore & Beck LLP

(57) ABSTRACT

A method for current sensor fault detection in a battery system comprises receiving a sequence of battery voltage samples from a voltage sensor configured to measure a battery voltage of a battery and a sequence of battery current samples from a current sensor configured to measure a battery current of the battery; determining a change in the battery voltage samples over a predetermined number of samples and a change in the battery current samples over the predetermined number of samples; checking whether a ratio of the change in the battery voltage samples and the change in the battery current samples is within an expected range for one of (i) a resistance of the battery and (ii) a conductance of the battery; and detecting a fault in the current sensor based on whether the ratio is within the expected range.

20 Claims, 3 Drawing Sheets

(51) Int. Cl.
*G01R 31/374* (2019.01)
*G01R 31/3842* (2019.01)
*G01R 31/28* (2006.01)
*G01R 31/389* (2019.01)

(52) U.S. Cl.
CPC ......... *G01R 31/374* (2019.01); *G01R 31/389* (2019.01); *G01R 31/3842* (2019.01)

(56) References Cited

U.S. PATENT DOCUMENTS

| | | | |
|---|---|---|---|
| 6,016,465 | A | 1/2000 | Kelly |
| 7,994,798 | B2 | 8/2011 | Williams et al. |
| 8,138,704 | B2 | 3/2012 | Chakrabarti et al. |
| 8,285,514 | B2 | 10/2012 | Anbari et al. |
| 8,867,181 | B2 | 10/2014 | Hasan et al. |
| 9,372,234 | B2 | 6/2016 | Wang et al. |
| 2004/0157113 | A1 | 8/2004 | Klang |
| 2006/0109009 | A1* | 5/2006 | Banke ................ G01R 31/1227 324/536 |
| 2011/0037476 | A1 | 2/2011 | Jung et al. |
| 2015/0066262 | A1* | 3/2015 | Chang .................. B60W 10/08 701/22 |
| 2016/0217627 | A1 | 7/2016 | Khalaschi et al. |
| 2016/0276969 | A1 | 9/2016 | Krefta |

FOREIGN PATENT DOCUMENTS

| | | |
|---|---|---|
| JP | 2014134169 A | 7/2014 |
| JP | 2016067077 A | 4/2016 |
| WO | 2007097190 A1 | 8/2007 |

\* cited by examiner

SENSOR FAULT DETECTION USING PAIRED SAMPLE CORRELATION

FIELD

The device and method disclosed in this document relates to battery systems and, more particularly, to sensor fault detection in battery systems.

BACKGROUND

Battery systems often include one or more sensors configured to monitor parameters of the battery, such as current and voltage, during operation. It many applications, reliable monitoring of battery parameters is critical to safe and efficient operation of the battery system. In certain automotive applications, on-board diagnostics (OBD) regulations require a two-sided rationality check for detecting current sensor faults. The current state of the art for detecting faults in a battery system's current sensor generally requires the inclusion of a second redundant current sensor. The system compares values of the two different current sensors. If the sensors' values differ too much, a fault will be suspected by the system. Accordingly, it would be advantageous to provide a system and method for detecting current sensor faults in a battery system having only one current sensor.

SUMMARY

A method of current sensor fault detection is disclosed. The method comprises: receiving a sequence of battery voltage samples from a voltage sensor configured to measure a battery voltage of a battery and a sequence of battery current samples from a current sensor configured to measure a battery current of the battery; determining a change in the battery voltage samples over a predetermined number of samples and a change in the battery current samples over the predetermined number of samples; checking whether a ratio of the change in the battery voltage samples and the change in the battery current samples is within an expected range for one of (i) a resistance of the battery and (ii) a conductance of the battery; and detecting a fault in the current sensor based on whether the ratio is within the expected range.

A battery system is disclosed. The battery system comprises includes: a battery operably connected to provide power to at least one load; a voltage sensor configured to measure a battery voltage of the battery; a current sensor configured to measure a battery current of the battery; and a controller operably connected to the voltage sensor and the current sensor. The controller is configured to: receive a sequence of battery voltage samples from the voltage sensor and a sequence of battery current samples from the current sensor; determine a change in the battery voltage samples over a predetermined number of samples and a change in the battery current samples over the predetermined number of samples; check whether a ratio of the change in the battery voltage samples and the change in the battery current samples is within an expected range for one of (i) a resistance of the battery and (ii) a conductance of the battery; and detect the fault in the current sensor based on whether the ratio is within the expected range.

BRIEF DESCRIPTION OF THE DRAWINGS

The foregoing aspects and other features of the system and method for detecting a sensor fault in a battery system are explained in the following description, taken in connection with the accompanying drawings.

DETAILED DESCRIPTION

Figure 1:
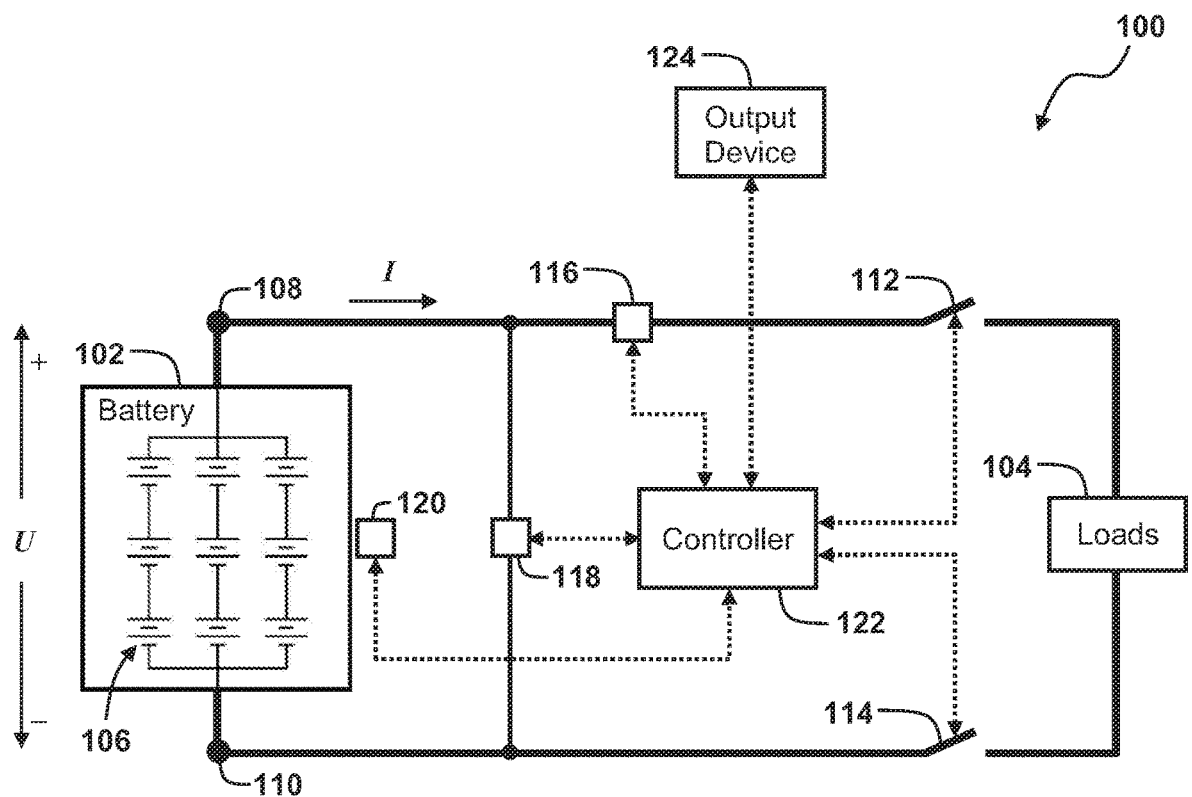
FIG. 1 shows a battery system according to the disclosure.

For the purposes of promoting an understanding of the principles of the disclosure, reference will now be made to the embodiments illustrated in the drawings and described in the following written specification. It is understood that no limitation to the scope of the disclosure is thereby intended. It is further understood that the present disclosure includes any alterations and modifications to the illustrated embodiments and includes further applications of the principles of the disclosure as would normally occur to one skilled in the art which this disclosure pertains.

FIG. 1 shows a battery system 100 according to the disclosure. In at least one embodiment, the battery system 100 is integrated into a vehicle, such as an electric vehicle or a full/mild/micro hybrid-electric vehicle. The battery system 100 includes a battery 102 operably connected and configured to provide power to loads 104. In at least one embodiment, the battery 102 comprises a plurality of individual battery cells 106 connected in series and/or in parallel with one another to provide an output voltage of the battery 102 (e.g. 12 Volts, 48 Volts, 200+ Volts) between a positive battery terminal 108 and a negative battery terminal 110. The battery cells 106 may comprise any of various types of battery cells, such as nickel-metal hydride or lithium-ion.

The loads 104 are connected to the battery 102 and configured to receive power from the battery 102 during operation. In some embodiments, the loads 104 are connected to the positive battery terminal 108 via a high-side switch 112 and to the negative battery terminal 110 via a low-side switch 114. The switches 112 and 114 may comprise electromechanical switches, such a relays or contactors, or electronic switches, such as power metal-oxide-semiconductor field-effect transistors (power MOSFET) or insulated-gate bipolar transistors (IGBT). In some embodiments, the loads 104 may include a traction motor of the vehicle or a vehicle electrical system. In some embodiments, the battery system 100 may include various power electronics (not shown) connected between the battery 102 and some or all of the loads 104, such a DC/DC converter configured to step down the battery voltage to that of the vehicle electrical system.

The battery system 100 further includes a current sensor 116, a voltage sensor 118, and a temperature sensor 120. The current sensor 116 is configured to measure a battery current I that flows through the battery 102. In one embodiment, the current sensor 116 includes a shunt resistor arranged in series with the battery 102 which provides a voltage that is proportional to the battery current I. In one embodiment, the current sensor 116 comprises a Hall Effect sensor arranged in series with the battery 102 and configured to measure the battery current I. The voltage sensor 118 is connected in parallel with the battery 102 and is configured to measure a battery voltage U across the positive and negative battery terminals 108 and 110 of the battery 102. In some embodiments, the voltage sensor 118 is further configured to measure voltages of individual cells 106 of the battery 102. The temperature sensor 120 is configured to measure a battery temperature T of the battery 102. In one embodiment, the temperature sensor 120 comprises several individual temperature sensors and the measured battery temperature T may be an minimum, maximum, or average of several measurements from the different sensors.

The battery system 100 further includes a controller 122, which is operably connected to the current sensor 116, the voltage sensor 118, and the temperature sensor 120. The controller 122 is configured to receive measurement values of the battery voltage U and the battery current I from the current sensor 116 and the voltage sensor 118. The controller 122 is at least configured to detect sensor faults of the current sensor 116. The controller 122 generally comprises at least one processor and at least one associated memory having program instructions stored thereon, which are executed by the at least one processor to achieve the described functionalities. It will be recognized by those of ordinary skill in the art that a "controller" or "processor" includes any hardware system, hardware mechanism or hardware component that processes data, signals, or other information. The controller 122 may include a system with a central processing unit, multiple processing units, or dedicated circuitry for achieving specific functionality. In some embodiments, the controller 122 is a battery management system, or a component thereof, which is configured to serve other functions in addition to sensor fault detection. In some embodiments, the controller 122 is operably connected to the switches 112 and 114 and configured to command the switches 112 and 114 to open and close. In some embodiments, the controller 122 is operably connected to an output device 124 and configured to operate the output device 124 to generate audible or visual alert. The output device 124 may comprise a speaker, a light, a display screen, or the like.

Various methods for detecting a sensor fault in the battery system are described below. In the description of the methods, statements that the method is performing some task or function refers to a controller or general purpose processor executing programmed instructions stored in non-transitory computer readable storage media operatively connected to the controller or processor to manipulate data or to operate one or more components in the system 100 to perform the task or function. Particularly, the controller 122 above may be such a controller or processor and the executed program instructions may be stored in a memory. Additionally, the steps of the methods may be performed in any feasible chronological order, regardless of the order shown in the figures or the order in which the steps are described.

Figure 2:
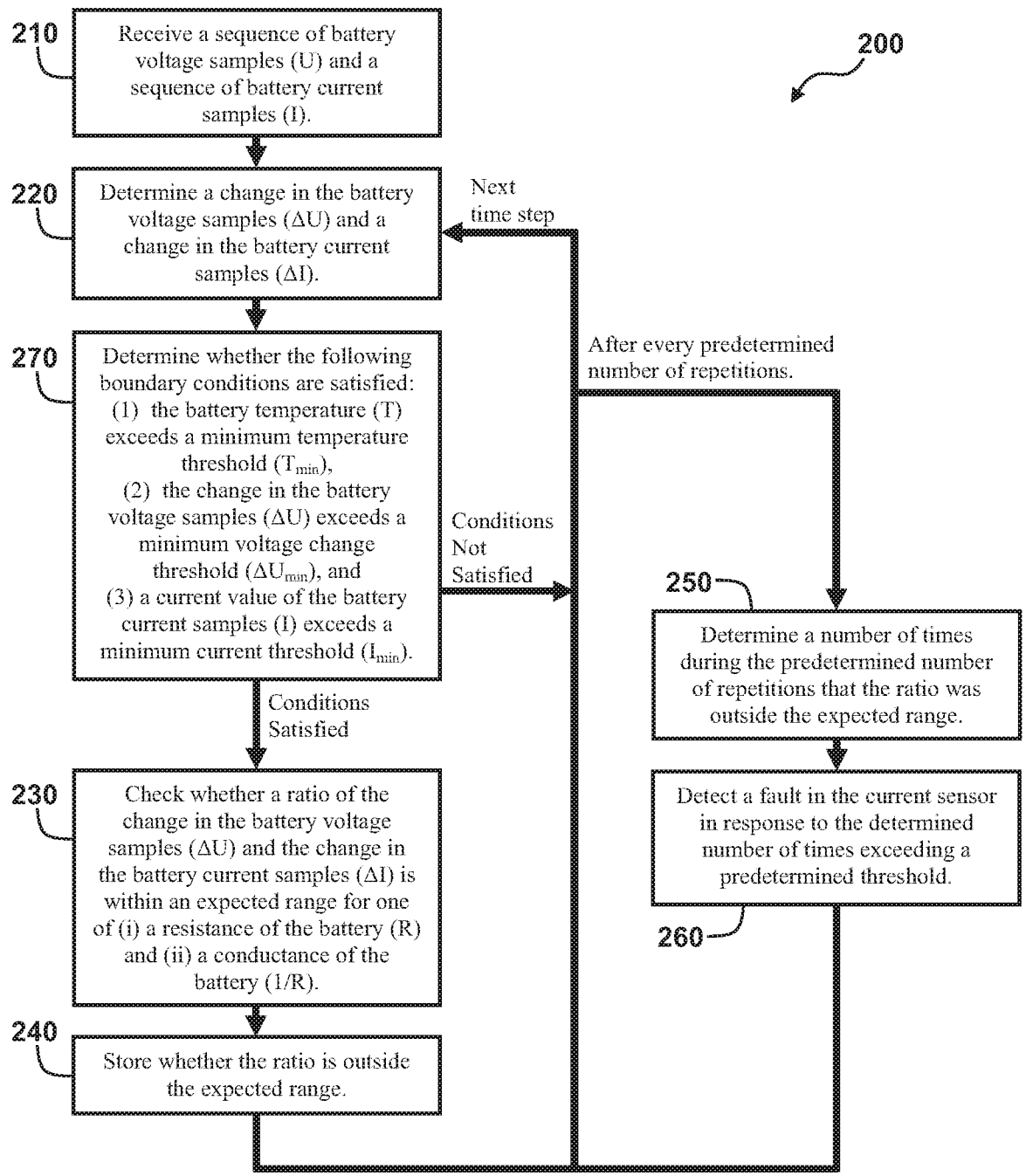
FIG. 2 shows a method of detecting a current sensor fault in a battery system.

FIG. 2 shows a method 200 for detecting a sensor fault in a battery system, such as the battery system 100. The method 200, referred to herein as a "Paired Sample Correlation" method, assesses a level of correlation between two sensor signals whose relationship is approximately linear within small regions by comparing of their relative behavior (i.e. relative change of the signals over time, as opposed to relative magnitude). In this way, the method is most useful for detecting a gain fault in the one of the sensors. Additionally, the method 200 is described herein as applied to a battery system having a single current sensor and a voltage sensor and for the purpose of detecting a gain fault in a current sensor. However, the method can be similarly applied to other applications having sensors which measure correlated signals.

The method 200 begins with a step of receiving a sequence of battery voltage samples and a sequence of battery current samples (block 210). Particularly, with respect to the embodiments described in detail herein, the current sensor 116 is configured to generate a sequence of measurement samples regarding a battery current I which flows through the battery 102. Similarly, the voltage sensor 118 is configured to generate a sequence of measurement samples regarding a battery voltage U across the battery terminals 108 and 110 of the battery 102. The controller 122 is configured receive the sequence of battery current samples from the current sensor 116 and the sequence of battery voltage samples from the voltage sensor 118. In some embodiments, the current sensor 116 and the voltage sensor 118 may instead be configured to generate analog measurement signals which are sampled by the controller 122 to provide the sequence of battery current samples and the sequence of battery voltage samples.

Figure 3:
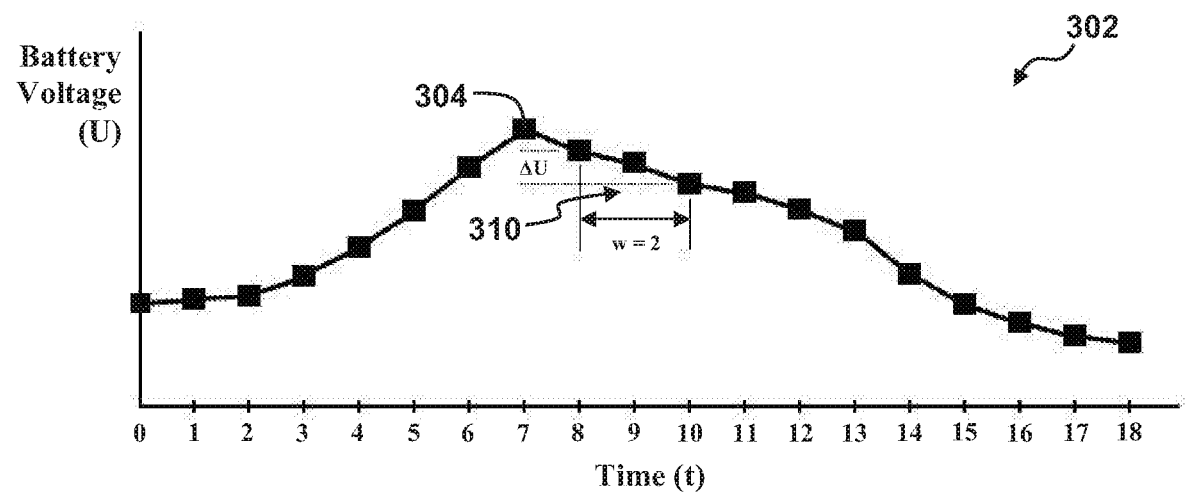
FIG. 3 shows exemplary sequences of battery voltage samples and battery current samples.
Figure 3:
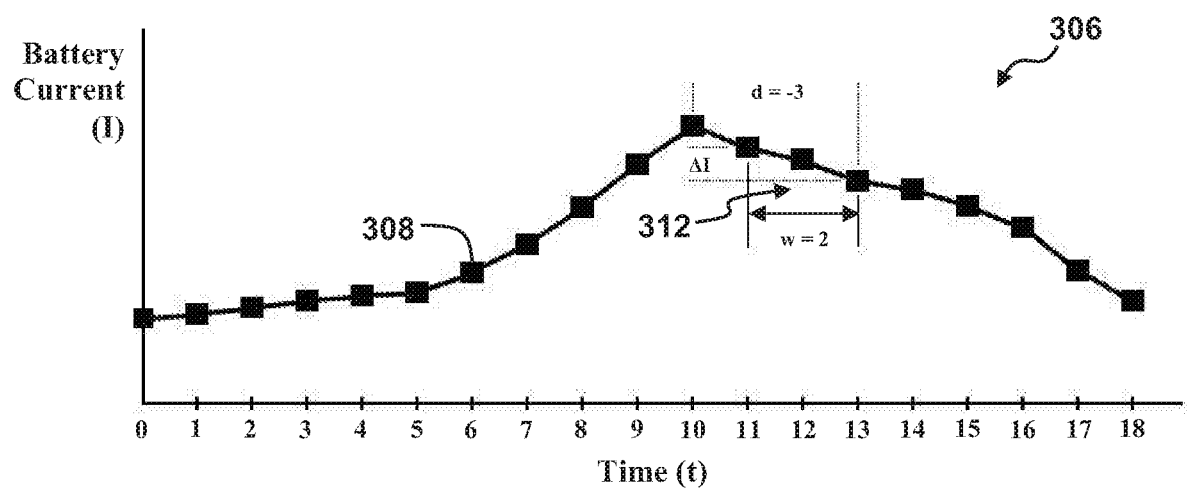

FIG. 3 shows exemplary sequences of battery voltage and battery current samples. Particularly, the plot 302 shows a sequence of battery voltage samples 304 generated by the voltage sensor 118 and received by the controller 122. Similarly, the plot 306 shows a sequence of battery current samples 308 generated by the current sensor 116 and received by the controller 122. As shown, the battery voltage samples 304 and battery current samples 308 span a plurality of time steps from t=0 to t=18. In at least one embodiment, the particular duration of time between each time step is a function of the sampling rate of the current sensor 116 and the voltage sensor 118. In some embodiments, the current sensor 116 and the voltage sensor 118 are configured with a common sampling rate and the time steps coincide with the common sample period of the current sensor 116 and the voltage sensor 118. In other embodiments, one of the sensors 116 and 118 has a sampling rate which is an multiple of the other of the sensors 116 and 118 and the time step may coincide with the longer of the sampling periods of the sensors 116 and 118, or otherwise coincide with a common multiple of the sampling periods, such as the least common multiple.

Returning to FIG. 2, the method 200 continues with a step of determining a change in the battery voltage samples and a change in the battery current samples (block 220). Particularly, with respect to the embodiments described in detail herein, the controller 122 is configured to determine a change in the battery voltage $\Delta U$ over a predetermined number of samples and a change in the battery current $\Delta I$ over the predetermined number of samples. Particularly, in at least one embodiment, the controller 122 is configured to calculate the change in the battery voltage $\Delta U$ based on the expression $\Delta U = U_s - U_{s-w}$, where s is the index for the current time step and w is the predetermined width of the sampling window, which is a positive integer of one or greater. Similarly, in at least one embodiment, the controller 122 is configured to calculate the change in the battery current $\Delta I$ based on the expression $\Delta I = I_{s-d} - I_{s-w-d}$, where d is a delay of the current relative to the voltage to compensate for any phase difference between the battery current I and the battery voltage U, which is a positive or negative integer or zero. For example, d=1 will correlate the voltage sample $U_s$ with the previous current sample $I_{s-1}$ and d=−2 will correlate the voltage sample $U_s$ with a subsequent current sample $I_{s+2}$. The phase difference between the battery current I and the battery voltage U may be a result of small differences in latency between the current sensor 116 and the voltage sensor 118, as well as any reactances in the battery circuit. FIG. 3 illustrates an exemplary battery voltage window 310 and battery current window 312, where the current time step s=t=10 and the window width w=2. Additionally, as shown, d=−3 in order to compensate for a delay of the battery current I by three time steps relative to the battery voltage U.

The method 200 continues with a step of checking whether a ratio of the change in the battery voltage samples and the change in the battery current samples is within an expected range for one of (i) a resistance of the battery and (ii) a conductance of the battery (block 230). Particularly, with respect to the embodiments described in detail herein, the controller 122 is configured to calculate a ratio of the change in the battery voltage ΔU and the change in the battery current ΔI. In at least one embodiment, the controller 122 is configured to calculate the ratio according to the expression $$\frac{\Delta U}{\Delta I} = \frac{U_s - U_{s\text{-}w}}{I_{s\text{-}d} - I_{s\text{-}w\text{-}d}},$$

but also may calculate the inverse ratio according to the expression $$\frac{\Delta I}{\Delta U} = \frac{I_{s\text{-}d} - I_{s\text{-}w\text{-}d}}{U_s - U_{s\text{-}w}}.$$

The controller 122 is configured to compare the ratio with an estimated resistance R of the battery 102 in the case that the ratio $$\frac{\Delta U}{\Delta I}$$

is formed, or an estimated conductance $$\frac{1}{R}$$

of the battery 102 in the case that the ratio $$\frac{\Delta I}{\Delta U}$$

is formed. In some embodiments, the controller 122 is configured to receive a temperature measurement T from temperature sensor 120, and determine an estimated resistance R of the battery 102 based on the measured temperature T using a mathematical model of the battery 102 or a resistance vs. temperature look-up table stored in an associated memory.

If the ratio is not sufficiently similar to the estimated resistance or conductance of the battery 102, a fault in one of the sensors 116 and 118 can be suspected. Particularly, the relative behavior of the battery current and the battery voltage is largely governed by Ohm's Law. Accordingly, when the sensors 116 and 118 are functioning appropriately, the ratio is expected to correspond to the internal resistance or the internal conductance of the battery 102. In some embodiments, the controller 122 is configured to determine whether the ratio $$\frac{\Delta U}{\Delta I}$$

is within a predetermined range of the estimated resistance R or, alternatively, whether the ratio $$\frac{\Delta I}{\Delta U}$$

is within a predetermined range of the estimated conductance $$\frac{1}{R}.$$

Particularly, in one embodiment the controller 122 is configured to determine whether the ratio is within an estimated range for the resistance R according to the expression $$R \cdot (1 + \delta_n) < \frac{U_s - U_{s\text{-}w}}{I_{s\text{-}d} - I_{s\text{-}w\text{-}d}} < R \cdot (1 + \delta_p),$$

where $\delta_n$ is the error in the estimated resistance R in the negative direction (e.g. −50%) and where $\delta_p$ is the error in the estimated resistance R in the positive direction (e.g. 59%). Alternatively, in the case that the ratio $$\frac{\Delta I}{\Delta U}$$

is formed, the controller 122 is configured to determine whether the ratio is within an estimated range for the conductance $$\frac{1}{R}$$

according to the expression $$\frac{1}{R \cdot (1 + \delta_n)} > \frac{I_{s\text{-}d} - I_{s\text{-}w\text{-}d}}{U_s - U_{s\text{-}w}} > \frac{1}{R \cdot (1 + \delta_p)}.$$

In one embodiment, the controller 122 is configured to periodically adjust over time the error $\delta_n$ and/or the error $\delta_p$ as a function of the measured temperature T, a performance of the temperature sensor 120, cell aging of the battery 102, a pulse profile, the state of charge of the battery 102, a polarity of the battery current I, and/or an uncompensated phase difference between the battery voltage U and the battery current I. Additionally, in some embodiments, the controller 122 is configured to adjust the error $\delta_n$ and/or the error $\delta_p$ as a function manufacturing variability of the battery 102, as a constant or one-time adjustment.

In some embodiments, the controller 122 is configured to detect a fault in one of the current sensor 116 and the voltage sensor 118 in response to the ratio being outside the estimated range for the resistance R or the conductance $$\frac{1}{R}.$$

In at least one embodiment, faults in the voltage sensor 118 are detected using other detection processes, and the controller 122 is configured to detect a fault of the current sensor 116 in response to the ratio being outside the estimated range for the resistance R or the conductance $$\frac{1}{R}.$$

In such embodiments, the controller 122 may be further configured to perform some kind of ameliorative operation in response to detecting the sensor fault. In one embodiment, the controller 122 is configured to operate the switches 112 and 114 to open in response to the detecting the fault, thereby disconnecting the terminals 108 and 110 of the battery 102 from the loads 104. In one embodiment, the controller 122 is configured to operate the output device 124 to generate audible or visual alert in response to the detecting the fault, thereby alerting a user of the detected sensor fault. In one embodiment, the controller 122 is configured to transmit a signal indicating the detected sensor fault to a higher level controller for further processing, such as On-Board-Diagnostics (OBD) evaluations using an in use monitoring performance ratio (IUMPR) or other real time monitoring techniques. In one embodiment, the controller 122 is configured to perform the On-Board-Diagnostics (OBD) evaluations itself based on the detection of the sensor fault.

However, in many embodiments, the method 200 instead continues with a step of storing whether the ratio is outside the expected range of the one of (i) the resistance of the battery and (ii) the conductance of the battery (block 240). Particularly, with respect to the embodiments described in detail herein, the controller 122 is configured to store whether the ratio is outside the estimated range for the resistance R or the conductance $$\frac{1}{R}.$$

In one embodiment, the controller 122 is configured to increment a counter (or omit a step of incrementing a counter) in response to the ratio being outside the estimated range for the resistance R or the conductance $$\frac{1}{R}.$$

In this way, the controller 122 is configured to count a number of times the check fails and/or passes. In one embodiment, the controller 122 is configured to store the result of the comparison (e.g. pass or fail, inside or outside) in association with the respective time step.

The method 200 continues by repeating the steps of determining the change in the battery voltage samples and the change in the battery current samples (block 220), checking whether the ratio of the change in the battery voltage samples and the change in the battery current samples is within the expected range for the one of (i) the resistance of the battery and (ii) the conductance of the battery (block 230), and storing whether the ratio is outside the expected range of the one of (i) the resistance of the battery and (ii) the conductance of the battery (block 240) for successive times steps of the battery voltage and battery current samples. Particularly, for a plurality of successive repetitions, the controller 122 is configured to increment the time step s by at least one time step and compare a ratio of the change in battery voltage and the change in battery current with a known resistance or conductance. Particularly, in at least one embodiment, for a plurality of successive repetitions, the controller 122 is configured to increment the time step s by one and reevaluate the expression $$R \cdot (1+\delta_n) < \frac{U_s - U_{s-w}}{I_{s-d} - I_{s-w-d}} < R \cdot (1+\delta_p)$$

or its inverse as discussed above. After each repetition, the controller 122 is configured to increment a counter based on the result or otherwise store the result in association with the respective time step.

After a predetermined number of repetitions, the method 200 continues with a step of determining a number of times during the predetermined number of repetitions that the ratio was outside the expected range (block 250). Particularly, after a predetermined number of successive repetitions, the controller 122 is configured to determine a number of times during the predetermined number of successive repetitions that the ratio was outside the estimated range for the resistance R or the conductance $$\frac{1}{R}.$$

In embodiments in which a counter was incremented in response to each time the ratio was outside the estimated range for the resistance R or the conductance $$\frac{1}{R},$$

the controller 122 is configured to read a value from the counter to determine the number of times. In other embodiments, the controller 122 is configured to read from memory the results associated with the previous time steps of the predetermined number of successive repetitions and count a number of times that the ratio was outside the estimated range for the resistance R or the conductance $$\frac{1}{R}.$$

If the determined number of times exceeds a predetermined threshold, the method 200 continues with a step of detecting a fault in the current sensor in response thereto (block 260). Particularly, the controller 122 is configured to detect a fault in one of the current sensor 116 and the voltage sensor 118 in response to the determined number of times that the ratio was outside the estimated range for the resistance R or the conductance $$\frac{1}{R}$$

exceeding a predetermined threshold (e.g. 20%). In at least one embodiment, faults in the voltage sensor 118 are detecting using other detection processes, and the controller 122 is configured to detect a fault of the current sensor 116 in response to the determined number of times exceeding the predetermined threshold (e.g. 20%). In one embodiment, the controller 122 is configured to periodically adjust over time the predetermined threshold as a function of the measured temperature T, a performance of the temperature sensor 120, cell aging of the battery 102, a pulse profile, the state of charge of the battery 102, a polarity of the battery current I, and/or an uncompensated phase difference between the battery voltage U and the battery current I. Additionally, in some embodiments, the controller 122 is configured to adjust the predetermined threshold as a function manufacturing variability of the battery 102, as a constant or one-time adjustment.

In some embodiments, in response to detecting the sensor fault, the controller 122 may be further configured to perform some kind of ameliorative operation. In one embodiment, the controller 122 is configured to operate the switches 112 and 114 to open in response to the detecting the fault, thereby disconnecting the terminals 108 and 110 of the battery 102 from the loads 104. In one embodiment, the controller 122 is configured to operate the output device 124 to generate audible or visual alert in response to the detecting the fault, thereby alerting a user of the detected sensor fault. In one embodiment, the controller 122 is configured to transmit a signal indicating the detected sensor fault to a higher level controller for further processing, such as On-Board-Diagnostics (OBD) evaluations using an in use monitoring performance ratio (IUMPR) or other real time monitoring techniques. In one embodiment, the controller 122 is configured to perform the On-Board-Diagnostics (OBD) evaluations itself based on the detection of the sensor fault.

After detecting or not detecting a fault in the current sensor, the method 200 returns to the process of repeating the steps of determining the change in the battery voltage samples and the change in the battery current samples (block 220), checking whether the ratio of the change in the battery voltage samples and the change in the battery current samples is within the expected range for the one of (i) the resistance of the battery and (ii) the conductance of the battery (block 230), and storing whether the ratio is outside the expected range of the one of (i) the resistance of the battery and (ii) the conductance of the battery (block 240) for successive times steps of the battery voltage and battery current samples, until another predetermined number of repetitions have been performed.

In some embodiments, the method 200 further includes a step of determining whether the following boundary conditions are satisfied: (1) the battery temperature exceeds a minimum temperature threshold, (2) the change in the battery voltage samples exceeds a minimum voltage change threshold, and/or (3) the current value of the battery current samples exceeds a minimum current threshold (block 270). Particularly, before checking whether the ratio is outside the estimated range for the resistance R or the conductance $$\frac{1}{R},$$

the controller 122 is configured to determine whether certain boundary conditions are satisfied. If the boundary conditions are not satisfied, the controller 122 is configured skip the step of checking whether the ratio outside the estimated range for the resistance R or the conductance $$\frac{1}{R}$$

and simply move on to the next time step of the process. In one embodiment, a boundary condition is that the current battery temperature T is greater than a minimum temperature threshold $T_{min}$, or in other words, the expression $T>T_{min}$ must be satisfied to avoid error due to large changes in cell internal resistance at low temperatures. In one embodiment, a boundary condition is that the change in the battery voltage $\Delta U$ is greater than a minimum change in battery voltage threshold $\Delta U_{min}$, or in other words, the expression $\Delta U>\Delta U_{min}$ must be satisfied to avoid checks with minimal changes in battery voltage. In one embodiment, a boundary condition is that the current battery current $I_s$ is greater than a minimum battery current threshold $I_{min}$, or in other words, the expression $I_s>I_{min}$ must be satisfied to avoid checks at low currents if necessary. In one embodiment, the controller 122 is configured to determine whether each of the boundary conditions $T>T_{min}$, $\Delta U>\Delta U_{min}$, and $I_s>I_{min}$ are satisfied and only check whether the ratio is outside the estimated range for the resistance R or the conductance $$\frac{1}{R}$$

in response to all of the boundary conditions being satisfied. In one embodiment, the controller 122 is configured to periodically adjust over time the minimum temperature threshold $T_{min}$, the minimum change in battery voltage threshold $\Delta U_{min}$, and/or minimum battery current threshold $I_{min}$ as a function of the measured temperature T, a performance of the temperature sensor 120, cell aging of the battery 102, a pulse profile, the state of charge of the battery 102, a polarity of the battery current I, and/or an uncompensated phase difference between the battery voltage U and the battery current I. Additionally, in some embodiments, the controller 122 is configured to adjust the minimum temperature threshold $T_{min}$, the minimum change in battery voltage threshold $\Delta U_{min}$, and/or minimum battery current threshold $I_{min}$ as a function manufacturing variability of the battery 102, as a constant or one-time adjustment.

The herein described paired sample correlation method improves the functioning of the battery system 100 by enabling the controller 122 to detect faults in the current sensor 116 without the necessary inclusion of a secondary current sensor. Furthermore, in battery systems which do include a secondary current sensor, the paired sample correlation method enables the controller 122 to provide further redundancy by detecting faults, particularly gain faults, in the current sensor 116. Unlike some other methods, the paired sample correlation method disclosed herein requires only a small amount of data to begin producing results (e.g. two samples), which is advantageous for real-time applications such as fault detection in a battery system. Furthermore, the low computational costs of each correlation check enable the method to run continuously on low-performance and low-cost hardware. The paired sample correlation method is easily calibrated due to intuitive nature of calibration variables (e.g., the predetermined pass/fail threshold or the values for the parameters $\delta_n$, $\delta_p$, $T_{min}$, $\Delta U_{min}$, and/or $I_{min}$ as discussed above) and low interdependence between calibration variables. The paired sample correlation method advantageously has logic which is more easily implemented because each type of calculation is performed either for every new sample (for which the boundary conditions are met) or every time the high-level evaluation is performed. This is in contrast to algorithms where some calculations are performed or not performed depending on the result of other calculations.

While the disclosure has been illustrated and described in detail in the drawings and foregoing description, the same should be considered as illustrative and not restrictive in character. It is understood that only the preferred embodiments have been presented and that all changes, modifications and further applications that come within the spirit of the disclosure are desired to be protected.

What is claimed is:

1. A method of current sensor fault detection comprising:
   receiving a sequence of battery voltage samples from a voltage sensor configured to measure a battery voltage of a battery and a sequence of battery current samples from a current sensor configured to measure a battery current of the battery, the sequence of battery voltage samples and the sequence of battery current samples both having been measured while the battery current was non-zero;
   determining a change in the battery voltage samples over a predetermined number of samples and a change in the battery current samples over the predetermined number of samples;
   checking whether a ratio of the change in the battery voltage samples and the change in the battery current samples is within an expected range for one of (i) a resistance of the battery and (ii) a conductance of the battery; and
   detecting a fault in the current sensor based on whether the ratio is within the expected range.

2. The method according to claim 1, the determining of the change in the battery voltage samples and the change in the battery current samples further comprising:
   determining the change in the battery voltage samples as a difference between a value of the battery voltage samples at a first time step and a value of the battery voltage samples at a second time step, the second time step being a first predetermined number of time steps after the first time step; and
   determining the change in the battery current samples as a difference between a value of the battery current samples at a third time step and a value of the battery current samples at a fourth time step, the fourth time step being the first predetermined number of time steps after the third time step, the third time step being a second predetermined number of time steps before or after the first time step.

3. The method according to claim 1 further comprising:
   receiving a battery temperature measurement from a temperature sensor configured to measure a temperature of the battery; and
   determining the expected range based on the battery temperature measurement.

4. The method according to claim 1, the detecting further comprising:
   detecting the fault based on the ratio being outside the expected range.

5. The method according to claim 1 further comprising:
   repeating the steps of determining and checking for successive time steps of the battery voltage samples and battery current samples;
   storing, for each repetition of the check, whether the ratio is outside the expected range;
   determining, after a predetermined number of repetitions of the check, a number of times of the predetermined number of repetitions that the ratio was outside the expected range; and
   detecting the fault in response to the number of times exceeding a predetermined threshold.

6. The method according to claim 5 further comprising:
   adjusting at least one of the expected range and the predetermined threshold based on at least one of (i) cell aging of the battery, (ii) a state of charge of the battery, (iii) a polarity of the battery current, and (iv) a phase difference between the battery current and battery voltage.

7. The method according to claim 1, the checking further comprising:
   only performing the check if at least one of (i) a battery temperature of the battery exceeds a minimum temperature threshold, (ii) the change in the battery voltage samples exceeds a minimum voltage change threshold, and (iii) a current value of the battery current samples exceeds a minimum current threshold.

8. The method according to claim 7 further comprising:
   adjusting at least one of the minimum temperature threshold, the minimum voltage change threshold, and the minimum current threshold based on at least one of (i) cell aging of the battery, (ii) a state of charge of the battery, (iii) a polarity of the battery current, and (iv) a phase difference between the battery current and battery voltage.

9. The method according to claim 1 further comprising:
   operating, in response to detecting the fault, an output device to generate one of (i) an audible alert and (ii) a visual alert.

10. The method according to claim 1 further comprising:
    operating, in response to detecting the fault, at least one switch to disconnect the battery from at least one load.

11. A battery system comprising:
    a battery operably connected to provide power to at least one load;
    a voltage sensor configured to measure a battery voltage of the battery;
    a current sensor configured to measure a battery current of the battery; and
    a controller operably connected to the voltage sensor and the current sensor, the controller being configured to:
       receive a sequence of battery voltage samples from the voltage sensor and a sequence of battery current samples from the current sensor, the sequence of battery voltage samples and the sequence of battery current samples both having been measured while the battery current was non-zero;
       determine a change in the battery voltage samples over a predetermined number of samples and a change in the battery current samples over the predetermined number of samples;
       check whether a ratio of the change in the battery voltage samples and the change in the battery current samples is within an expected range for one of (i) a resistance of the battery and (ii) a conductance of the battery; and detect the fault in the current sensor based on whether the ratio is within the expected range.

12. The battery system according to claim 11, the controller being further configured to:
   determine the change in the battery voltage samples as a difference between a value of the battery voltage samples at a first time step and a value of the battery voltage samples at a second time step, the second time step being a first predetermined number of time steps after the first time step; and
   determine the change in the battery current samples as a difference between a value of the battery current samples at a third time step and a value of the battery current samples at a fourth time step, the fourth time step being the first predetermined number of time steps after the third time step, the third time step being a second predetermined number of time steps after the first time step.

13. The battery system according to claim 11 further comprising:
   a temperature sensor configured to measure a temperature of the battery,
   wherein the controller is further configured to:
      receive a battery temperature measurement from the temperature sensor; and
      determine the expected range based on the battery temperature measurement.

14. The battery system according to claim 11, the controller being further configured to:
   detect the fault in response to the ratio being outside the expected range.

15. The battery system according to claim 11, the controller being further configured to:
   repeat the determination and the check for successive time steps of the battery voltage samples and battery current samples;
   store, for each repetition of the check, whether the ratio is outside the expected range;
   determine, after a predetermined number of repetitions of the check, a number of times of the predetermined number of repetitions that the ratio was outside the expected range; and
   detect the fault in response to the number of times exceeding a predetermined threshold.

16. The battery system according to claim 15, the controller being further configured to:
   adjust at least one of the expected range and the predetermined threshold based on at least one of (i) cell aging of the battery, (ii) a state of charge of the battery, (iii) a polarity of the battery current, and (iv) a phase difference between the battery current and battery voltage.

17. The battery system according to claim 11, the controller being further configured to:
   only perform the check if at least one of (i) a battery temperature of the battery exceeds a minimum temperature threshold, (ii) the change in the battery voltage samples exceeds a minimum voltage change threshold, and (iii) a current value of the battery current samples exceeds a minimum current threshold.

18. The battery system according to claim 17, the controller being further configured to:
   adjust at least one of the minimum temperature threshold, the minimum voltage change threshold, and the minimum current threshold based on at least one of (i) cell aging of the battery, (ii) a state of charge of the battery, (iii) a polarity of the battery current, and (iv) a phase difference between the battery current and battery voltage.

19. The battery system according to claim 11, the controller being further configured to:
   operate, in response to detecting the fault, an output device to generate one of (i) an audible alert and (ii) a visual alert.

20. The battery system according to claim 11, the controller being further configured to:
   operate, in response to detecting the fault, at least one switch to disconnect the battery from the at least one load.

* * * * *